(12) United States Patent
Kaspar et al.

(10) Patent No.: US 7,897,881 B2
(45) Date of Patent: Mar. 1, 2011

(54) ARRANGEMENT FOR HERMETICALLY SEALING COMPONENTS, AND METHOD FOR THE PRODUCTION THEREOF

(75) Inventors: Michael Kaspar, Putzbrunn (DE);
Herbert Schwarzbauer, München (DE);
Karl Weidner, München (DE)

(73) Assignee: Siemens Aktiengesellschaft, Munich (DE)

( * ) Notice: Subject to any disclaimer, the term of this patent is extended or adjusted under 35 U.S.C. 154(b) by 408 days.

(21) Appl. No.: 11/990,263

(22) PCT Filed: Jul. 28, 2006

(86) PCT No.: PCT/EP2006/064787
§ 371 (c)(1),
(2), (4) Date: Feb. 11, 2008

(87) PCT Pub. No.: WO2007/017404
PCT Pub. Date: Feb. 15, 2007

(65) Prior Publication Data
US 2010/0089633 A1    Apr. 15, 2010

(30) Foreign Application Priority Data
Aug. 10, 2005    (DE)    ........................ 10 2005 037 869

(51) Int. Cl.
*H05K 9/00*    (2006.01)
(52) U.S. Cl. ........................ 174/382; 174/564; 174/524; 257/680; 257/659

(58) Field of Classification Search ................ 174/377, 174/382, 386, 524, 564; 361/816, 818; 257/659, 257/680
See application file for complete search history.

(56) References Cited

U.S. PATENT DOCUMENTS

| | | | |
|---|---|---|---|
| 5,439,849 A | 8/1995 | McBride et al. | |
| 5,639,989 A | 6/1997 | Higgins, III | |
| 6,492,194 B1 | 12/2002 | Bureau et al. | |
| 6,781,231 B2* | 8/2004 | Minervini | 257/704 |
| 2003/0138991 A1* | 7/2003 | Kung | 438/106 |
| 2007/0030661 A1* | 2/2007 | Morris et al. | 361/818 |
| 2007/0199738 A1* | 8/2007 | Gabower | 174/350 |
| 2008/0055878 A1* | 3/2008 | Salzman | 361/818 |

FOREIGN PATENT DOCUMENTS

| | | |
|---|---|---|
| EP | 1 093 159 | 4/2001 |
| JP | 62-18739 | 1/1987 |

* cited by examiner

*Primary Examiner*—Hung V Ngo
(74) *Attorney, Agent, or Firm*—Staas & Halsey LLP

(57) ABSTRACT

Disclosed is a method for producing a package. According to said method, a substrate is provided, on a surface of which one or several components are disposed, and a hermetically sealing protective layer is formed on the one or several components and on the surface of the substrate. The hermetically sealing protective layer is impermeable to gas, liquid, and electromagnetic waves, temperature-resistant, electrically insulating, and process-resistant.

41 Claims, 2 Drawing Sheets

ARRANGEMENT FOR HERMETICALLY SEALING COMPONENTS, AND METHOD FOR THE PRODUCTION THEREOF

CROSS REFERENCE TO RELATED APPLICATIONS

This application is based on and hereby claims priority to German Application No. 10 2005 037 869.2 filed on Aug. 10, 2004 and PCT Application No. PCT/EP2006/064787 filed on Jul. 28, 2006, the contents of which are hereby incorporated by reference.

BACKGROUND OF THE INVENTION

Encapsulated components can be damaged and rendered non-operational by mechanical action and environmental influences. Environmental influences include for example corrosive gases such as oxygen, liquids such as water, organic and inorganic acids or electromagnetic fields. The pollutants exercise their harmful effects in particular under the influence of higher temperatures by destroying packaging materials, such as molding compounds, epoxy resins or polyimides, or the components themselves. The higher temperature assists the diffusion process of the pollutants through the packaging material or along boundary layers of the packaging material. If the component is not protected by a metal housing, electromagnetic fields can penetrate unimpeded to the component and damage it. Typical packages comprise plastic seals but these do not protect the component hermetically from environmental influences.

Hermetically sealing packages for protecting from environmental influences comprise in particular metal or ceramic housings. Known hermetically sealing housings have a housing base and a cover or hood. The housing is hermetically sealed by welding or soldering the cover onto the housing base. The housing base and cover can take up large parts of the surface of a printed circuit board or a module, on which the component is mounted.

SUMMARY

One potential object is therefore to create an improved hermetic seal for a component.

The inventors propose a method for producing a package. The method includes the provision of a substrate, with one or more components arranged on an upper surface of the substrate. The method also includes the forming of a hermetically sealing protective layer on the one or more components and on the upper surface of the substrate, the hermetically sealing protective layer having the following characteristics: gas impermeability, liquid impermeability, impermeability to electromagnetic waves, heat resistance, electrical insulation and process resistance.

In one embodiment the forming of the hermetically sealing protective layer comprises the forming of a plurality of sub-layers arranged one on top of the other. This has the advantage that sub-layers can be formed with different functionalities.

The forming of a plurality of sub-layers arranged one on top of the other advantageously comprises the application by lamination of a film made of an electrically insulating plastic material, with a film made of a plastic material with a polyimide, polyamide, polyethylene, polyphenol, polyetheretherketone and/or epoxy resin base preferably being used.

The forming of a plurality of sub-layers arranged one on top of the other advantageously comprises the forming of a metallic sub-layer featuring a metal, the sub-layer featuring a metal protecting the one or more components from electromagnetic radiation. The metal is preferably selected from a group consisting of aluminum, copper, titanium and nickel.

In one embodiment the forming of a plurality of sub-layers arranged one on top of the other comprises the forming of an inorganic sub-layer featuring an inorganic material. The inorganic material preferably contains silicon oxide.

In one embodiment the forming of a plurality of sub-layers arranged one on top of the other comprises the forming of an organic sub-layer featuring an organic material. The organic material preferably contains parylene.

In one embodiment the forming of the hermetically sealing protective layer comprises the forming of a hermetically sealing protecting layer featuring a filler material. The filler material preferably contains silicon oxide or carbon.

In one embodiment the provision of a substrate comprises the provision of an insulating layer, a first metallic layer applied to a lower surface of the insulating layer and a second, structured metallic layer applied to a surface of the insulating layer facing away from the lower surface.

The forming of the hermetically sealing protective layer can comprise a physical separation process, for example a sputter process or vaporization process.

The forming of the hermetically sealing protective layer can also comprise a spray process or a casting process.

The forming of the hermetically sealing protective layer can comprise a chemical separation method such as a CVD method or an LPCVD method.

In one embodiment the method for producing a package also comprises the exposing of one or more contact areas on the surface of the substrate and on surfaces of the one or more components by opening respective windows in the hermetically sealing protective layer and surface contact of each exposed contact area with a contact layer made of electrically conducting material. Respective windows can be opened using a photolithographic process, laser ablation, an etching method or a mechanical method.

In one embodiment a contact layer made up of a plurality of sub-layers of different, electrically conducting material arranged one on top of the other is used.

The inventors also propose a package, with the package comprising a substrate, one. or more components being formed on a surface of the substrate and a hermetically sealing protective layer being formed on the one or more components and on the surface of the substrate, said hermetically sealing protective layer having the following characteristics: gas impermeability, liquid impermeability, impermeability to electromagnetic waves, heat resistance, electrical insulation and process resistance.

The hermetically sealing protective layer preferably comprises a plurality of sub-layers arranged one on top of the other.

In one embodiment one of the number of sub-layers is formed from a film made of electrically insulating plastic. The film is preferably made of a plastic material with a polyimide, polyamide, polyethylene, polyphenol, polyetheretherketone and/or epoxy resin base.

In one embodiment one of the number of sub-layers is a metallic layer featuring a metal. The metal is preferably selected from a group consisting of aluminum, copper, titanium and nickel.

In one embodiment one of the number of sub-layers is an inorganic layer featuring an inorganic material. The inorganic material preferably comprises silicon oxide.

In one embodiment one of the number of sub-layers is a layer featuring an organically modified ceramic.

In one embodiment one of the number of sub-layers is an organic layer featuring an organic material, the organic material preferably being parylene.

In one embodiment the hermetically sealing protective layer contains a filler material. The filler material advantageously contains silicon oxide or carbon.

In one embodiment the substrate includes an insulating layer, a first metallic layer applied to a lower surface of the insulating layer and a second, structured metallic layer applied to a surface of the insulating layer facing away from the lower surface.

In one embodiment contact areas are arranged on the surface of the substrate and on surfaces of the one or more components. The hermetically sealing protective layer has a window for each contact area, in which window said contact area is free of the hermetically sealing protective layer and is in surface contact with a contact layer made of electrically conductive material. The contact layer can comprise a plurality of individual layers of different electrically conductive material arranged one on top of the other.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
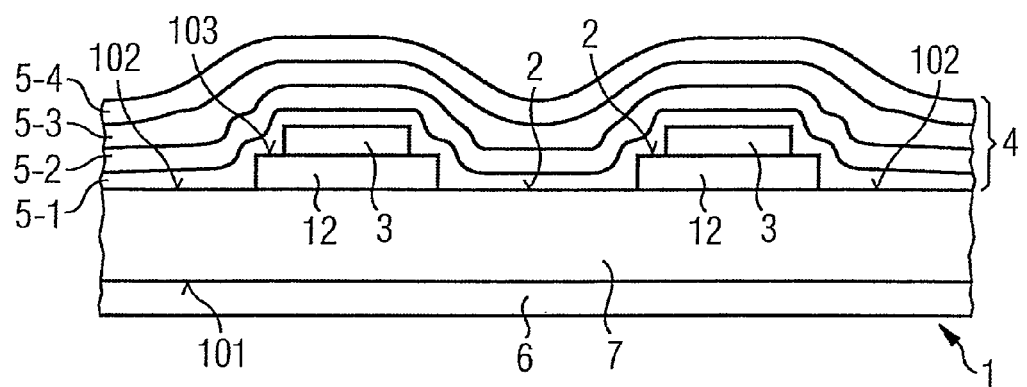
FIG. 1 shows a cross-section of a package according to one embodiment.

Reference will now be made in detail to the preferred embodiments of the present invention, examples of which are illustrated in the accompanying drawings, wherein like reference numerals refer to like elements throughout.

FIG. 1 shows a cross-section of a package according to one embodiment of the proposed method and package. Components 3 are arranged on a substrate 1 on an upper surface 2 of said substrate 1. The substrate has a DCB substrate for example, including an insulating layer 7, preferably made of a ceramic material, a first metallic layer 6 applied to a lower surface 101 of the insulating layer 7, preferably made of copper, and a second metallic layer 12 applied to an upper surface 102 of the insulating layer 7 facing away from the lower surface 101, preferably made of copper.

The second metallic layer 12 on the upper surface 102 of the insulating layer 7 is removed in some regions down to the upper surface 102. Components 3 are arranged on the surface 103 of the second metallic layer 12 facing away from the first metallic layer 6.

The overall upper surface of the substrate 1 fitted with the components 3, generally marked as 2, is defined by the exposed parts of the upper surface 102 of the insulating layer 7 and the upper surface 103 of the second metallic layer 12.

The components can be identical to each other or different from each other. The components are power semiconductor chips for example. A hermetically sealing layer 4 is arranged on the components 3, in close contact with surfaces and side areas of the components 3. The hermetically sealing layer 4 is also arranged on regions of the upper surface 2 of the substrate 1 between the components 3 and is in close contact with the upper surface 2 of the substrate 1. The hermetically sealing layer 4 seals each individual component 3 hermetically against environmental influences. The hermetic protective layer 4 is in particular gas impermeable, liquid impermeable, impermeable to electromagnetic waves, heat resistant, electrically insulating and process-resistant. In one embodiment the hermetic protective layer 4 is heat resistant to the long-term influence of temperatures up to 150° C. In another embodiment the hermetic protective layer 4 is heat resistant to the long-term influence of temperatures up to 200° C. The hermetic protective layer 4 is preferably process-resistant to the influence of acids, bases and solvents.

The hermetically sealing layer 4 can contain inorganic materials, organic materials, metals, polymers or organically modified ceramics. The hermetically sealing layer 4 can however also contain other suitable materials, which protect against environmental influences. Metals that are particularly suitable include aluminum, copper, titanium or nickel. The metals can be applied for example by a sputter method or a vapor deposition method. Polymers that are particularly suitable include duroplastic polymers or thermoplastic polymers.

The hermetically sealing protective layer 4 can also contain one or more filler materials. The selection of the filler material and the variation of the ratio of filler material in the hermetically sealing protective layer 4 make it possible for example to tailor the thermal expansion coefficient of the hermetically sealing protective layer 4 to the thermal expansion coefficient of the substrate 1 or the components 3. This makes it possible to reduce thermal stresses, which occur due to temperature influences. Thermal stresses can lead to cracks in or damage to the hermetically sealing protective layer 4 or can reduce the adhesion of the hermetically sealing protective layer 4 to the components 3 and the substrate 1.

The hermetically sealing protective layer 4 can comprise a plurality of sub-layers 5 arranged one on top of the other. The individual sub-layers 5 preferably feature different functional materials. For example a first sub-layer 5-1 is electrically insulating, a second sub-layer 5-2 is impermeable to electromagnetic waves, a third sub-layer 5-3 is impermeable to liquids and gases. A fourth sub-layer 5-4 protects the components 3 from mechanical damage.

In one embodiment a first sub-layer 5-1 contains a film applied by vacuum-lamination and is formed of electrically insulating plastic material. To improve adhesion to the upper surface 2 of the substrate 1 and to the components 3, the film can have an adhesive coating. The thickness of the film can be 25 to 500 μm.

A second sub-layer 5-2 is formed as a metallic layer. The metallic layer is applied in close contact with the first sub-layer 5-1 and has an adequate thickness to protect the components 3 from electromagnetic waves. The metallic layer preferably comprises aluminum, copper, titanium or nickel. The metallic layer can be applied to the laminated film by a sputter process or a vapor deposition process.

A third sub-layer 5-3 is formed as an organic layer and preferably comprises parylene. The organic layer is applied in close contact with the second sub-layer 5-2 and has an adequate thickness to protect the components 3 and the sub-layers 5-1 and 5-2 arranged underneath from liquids and gases.

A fourth sub-layer 5-4, which is preferably a packaging layer, preferably comprises synthetic resin or another suitable molding material. The fourth sub-layer 5-4 protects the components 3 from mechanical damage.

The sequence and number of the sub-layers 5 arranged one on top of the other can also vary. For example the second sub-layer 5-2 can be formed as an organic layer and the third sub-layer 5-3 as a metallic layer.

Figure 2:
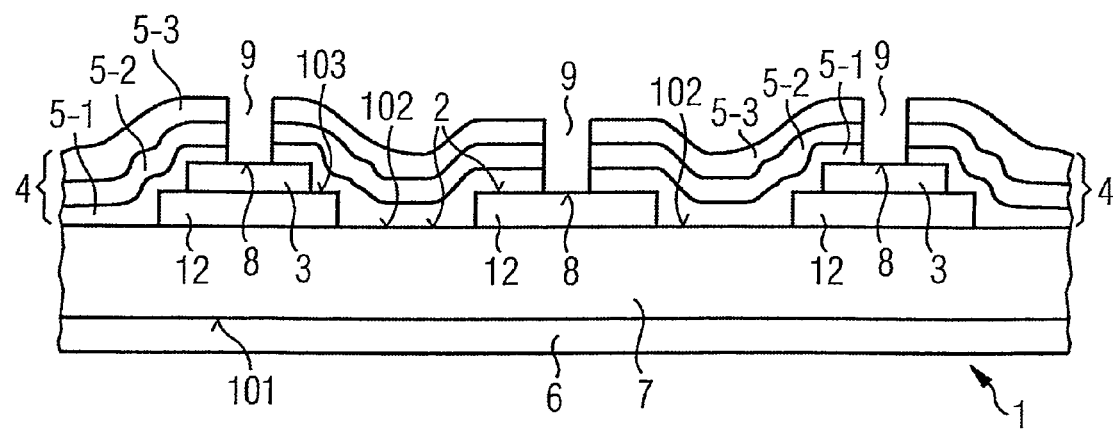
FIG. 2 shows a cross-section of a package in one stage of the production process according to one embodiment.

FIG. 2 shows a cross-section of a package in one stage of the production process according to one embodiment. Contact areas 8 on surfaces of the components 3 and on the upper surface 2 of the substrate 1 are exposed by opening windows 9 in the hermetically sealing layer 4. The windows 9 are opened by a structuring process. In one embodiment the hermetically sealing layer 4 is removed by laser ablation in the region of the contact areas 8. But other variants of the structuring of the hermetically sealing layer 4 are also possible. For example the hermetically sealing layer 4 can be structured by a plasma etching method. Structuring can however also be effected by a photolithographic process. To this end a photo-resist can be applied to the hermetically sealing layer 4, dried and then exposed to light. Possible photo-resists are conventional positive or negative resists (coating materials). The photo-resist can be applied for example using a spray or dipping process. However the photo-resist can also be applied using electro-deposition.

Individual sub-layers 5 of the hermetically sealing layer 4 can be structured using different structuring processes. For example a sub-layer 5 formed as a metallic layer can be structured by a plasma etching method and a sub-layer 5 formed from electrically insulating plastic material can be structured by a photolithographic process.

Figure 3:
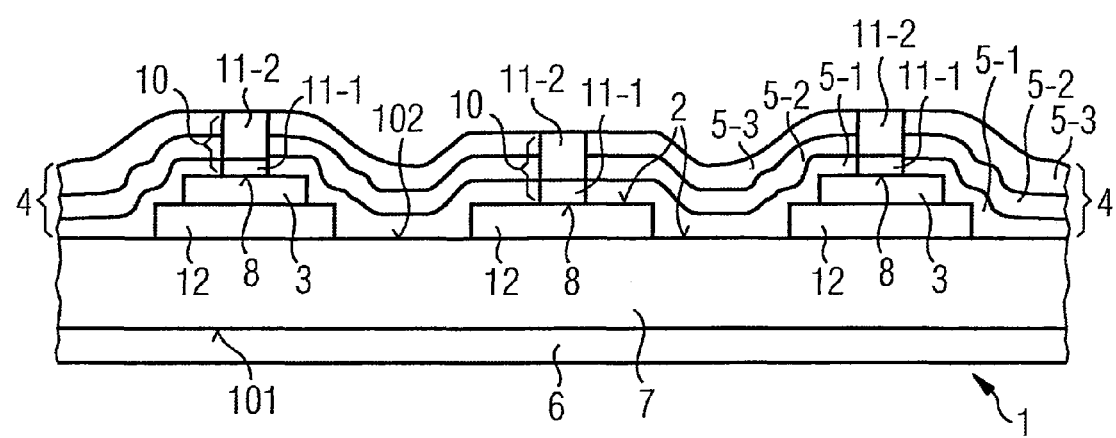
FIG. 3 shows a cross-section of a package according to one embodiment.

FIG. 3 shows a cross-section of the package shown in FIG. 2 after application of a structured contact layer 10 made of electrically conductive material 10, preferably a metal, to the exposed contact areas 8. Application of the electrically conductive material 10 to the exposed contact areas 8 can include the application of a mask to the hermetically sealing layer 4, which leaves the contact areas 8 exposed. The electrically conductive material is then brought into full surface contact with the hermetically sealing layer 4 and the exposed contact areas 8. The mask with the contact layer 10 thereon is then removed, so that only the contact areas 8 with surface contact remain on the mask-free regions. The contact layer 10 can also comprise a plurality of individual layers 11-1, 11-2 made of different electrically conductive material arranged one on top of the other.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A method for the production of a package comprising:
providing a substrate with one or more components arranged on an upper surface of the substrate;
forming a hermetically sealing protective layer on the one or more components and on the upper surface of the substrate, with the hermetically sealing protective layer being gas impermeable, liquid impermeable, impermeable to electromagnetic waves, heat resistant, electrical insulating and process resistant;
exposing a contact area to the one or more components by opening a respective window in the hermetically sealing protective layer; and
bringing an electrical conducting material into contact with the contact area.

2. The method for the production of a package as claimed in claim 1, wherein forming the hermetically sealing protective layer comprises forming a plurality of sub-layers stacked one on top of another.

3. The method for the production of a package as claimed in claim 2, wherein forming of the plurality of sub-layers comprises laminating a film made of an electrically insulating plastic material.

4. The method for the production of a package as claimed in claim 3, wherein the plastic material is selected from the group consisting of a polyimide, a polyamide, a polyethylene, a polyphenol, a polyetheretherketone and an epoxy resin.

5. The method for the production of a package as claimed in claim 2, wherein forming the plurality of sub-layers comprises forming a metallic sub-layer.

6. The method for the production of a package as claimed in claim 5, wherein the metallic sub-layer is formed from a metal selected from the group consisting of aluminium, copper, titanium and nickel.

7. The method for the production of a package as claimed in claim 2 wherein forming the plurality of sub-layers comprises forming an inorganic layer.

8. The method for the production of a package as claimed in claim 7, wherein the inorganic layer contains silicon oxide.

9. The method for the production of a package as claimed in claim 2, wherein forming the plurality of sub-layers comprises forming an organic layer from an organic material.

10. The method for the production of a package as claimed in claim 9, wherein the organic material contains parylene.

11. The method for the production of a package as claimed in claim 2, wherein forming the plurality of sub-layers comprises forming a layer of an organically modified ceramic.

12. The method for the production of a package as claimed in claim 1, wherein forming the hermetically sealing protective layer comprises forming a filler layer.

13. The method for the production of a package as claimed in claim 12, wherein the filler layer contains silicon oxide or carbon.

14. The method for the production of a package as claimed in claim 1, wherein the substrate comprises:
an insulating layer having upper and lower opposing surfaces;
a first metallic layer applied to the lower surface of the insulating layer; and
a second metallic layer applied to the upper surface of the insulating layer, the second metallic layer being a structured metallic layer.

15. The method for the production of a package as claimed in claim 1, wherein the hermetically sealing protective layer is formed by a physical separation method.

16. The method for the production of a package as claimed in claim 15, wherein the physical separation method comprising a sputter process or a vaporization process.

17. The method for the production of a package as claimed in claim 1, wherein the hermetically sealing protective layer is formed by a spray process.

18. The method for the production of a package as claimed in claim 1, wherein the hermetically sealing protective layer is formed by a casting process.

19. The method for the production of a package as claimed in claim 1, wherein the hermetically sealing protective layer is formed by a chemical separation method.

20. The method for the production of a package as claimed in claim 19, wherein the chemical separation method is a chemical vapour deposition method or a low pressure chemical vapour deposition method.

21. The method as claimed in claim 1, wherein the window is opened by a photolithographic process.

22. The method as claimed in claim 1, wherein window is opened by laser ablation.

23. The method as claimed in claim 1, wherein window is opened by an etching method.

24. The method as claimed in claim 1, wherein the window is opened by a mechanical method.

25. The method as claimed in claim 1, wherein the electrically conducting material is brought into contact with the contact area by forming a plurality of individual layers of different electrically conducting materials stacked one on top of another.

26. A package comprising:
a substrate having a surface;
a component formed on the surface of the substrate; and
a hermetically sealing protective layer formed on the component and on the surface of the substrate, the protective layer being gas impermeable, liquid impermeable, impermeable to electromagnetic waves, heat resistant, electrical insulating and process resistant, wherein
the component has a contact area exposed through a window in hermetically sealing protective layer, and
a contact layer of an electrically conductive material is formed in the window to contact the contact area.

27. The package as claimed in claim 26, wherein the hermetically sealing protective layer comprises a plurality of sub-layers stacked one on top of another.

28. The package as claimed in claim 27, wherein at least one of the sub-layers is formed of an electrically insulating plastic.

29. The package as claimed in claim 28, wherein the electrically insulating plastic is selected from the group consisting of a polyimide, a polyamide, a polyethylene, a polyphenol, a polyetheretherketone and an epoxy resin.

30. The package as claimed in claim 27, wherein at least one of the sub-layers is a metallic layer.

31. The package as claimed in claim 30, wherein the metallic layer is formed from a metal selected from the group consisting of aluminium, copper, titanium and nickel.

32. The package as claimed in claim 27, wherein at least one of the sub-layers is an inorganic layer formed of an inorganic material.

33. The package as claimed in claim 32, wherein the inorganic material contains silicon oxide.

34. The package as claimed in claim 27, wherein at least one of the sub-layers is an organic layer formed of an organic material.

35. The package as claimed in claim 34, wherein the inorganic material contains parylene.

36. The package as claimed in claim 27, wherein at least one of the sub-layers is an organic modified ceramic.

37. The package as claimed in claim 26, wherein the hermetically sealing protective layer is formed from a filler material.

38. The package as claimed in claim 37, wherein the filler material is silicon oxide or carbon.

39. The package as claimed in claim 26, wherein the substrate comprises:
an insulating layer having upper and lower opposing surfaces;
a first metallic layer applied to the lower surface of the insulating layer; and
a second metallic layer applied to the upper surface of the insulating layer, the second metallic layer being a structured metallic layer.

40. The package as claimed in claim 26, wherein the contact layer comprises a plurality of individual layers of respective materials having different electrical conductivities stacked one on top of another.

41. A package comprising:
an insulating layer having upper and lower opposing surfaces;
a first metallic layer applied to the lower surface of the insulating layer;
a second metallic layer applied to the upper surface of the insulating layer, the second metallic layer being patterned to have base portions;
a plurality of electrical components formed respectively on the base portions of the substrate second metallic layer; and
a hermetically sealing protective layer formed on the components, the second metallic layer and the upper surface of the substrate, the hermetically sealing protective layer comprising a plurality of sub-layers stacked one on top of another, the sub-layers comprising:
an electrically insulating plastic selected from the group consisting of a polyimide, a polyamide, a polyethylene, a polyphenol, a polyetheretherketone and an epoxy resin;
a metallic layer formed from a metal selected from the group consisting of aluminium, copper, titanium and nickel; and
an organic layer formed of an organic material containing parylene, wherein
the components each have a contact area exposed through a window in hermetically sealing protective layer, and
an electrically conductive material is formed in each window to contact the contact areas.

* * * * *